(12) United States Patent
Marchena

(10) Patent No.: US 9,184,094 B1
(45) Date of Patent: Nov. 10, 2015

(54) METHOD AND SYSTEM FOR FORMING A MEMBRANE OVER A CAVITY

(71) Applicant: SKORPIOS TECHNOLOGIES, INC., Albuquerque, NM (US)

(72) Inventor: Elton Marchena, Albuquerque, NM (US)

(73) Assignee: Skorpios Technologies, Inc., Albuquerque, NM (US)

(*) Notice: Subject to any disclaimer, the term of this patent is extended or adjusted under 35 U.S.C. 154(b) by 0 days.

(21) Appl. No.: 13/750,163

(22) Filed: Jan. 25, 2013

Related U.S. Application Data

(60) Provisional application No. 61/590,887, filed on Jan. 26, 2012.

(51) Int. Cl.
| | |
|---|---|
| H01L 21/30 | (2006.01) |
| H01L 33/00 | (2010.01) |
| H01L 33/48 | (2010.01) |
| H01L 21/78 | (2006.01) |
| H01L 21/762 | (2006.01) |
| H01L 21/764 | (2006.01) |

(52) U.S. Cl.
CPC ...... *H01L 21/7806* (2013.01); *H01L 21/76251* (2013.01); *H01L 21/76254* (2013.01); *H01L 33/0079* (2013.01); *H01L 21/764* (2013.01)

(58) Field of Classification Search
CPC .............. H01L 27/14618; H01L 21/76254
USPC ........................................ 438/458, 456, 459
See application file for complete search history.

(56) References Cited

U.S. PATENT DOCUMENTS

| | | | |
|---|---|---|---|
| 5,804,086 A * | 9/1998 | Bruel | 216/33 |
| 7,732,301 B1 * | 6/2010 | Pinnington et al. | 438/455 |
| 8,187,960 B2 * | 5/2012 | Lee et al. | 438/584 |
| 2002/0063341 A1 * | 5/2002 | Fukumi | 257/777 |
| 2003/0064535 A1 * | 4/2003 | Kub et al. | 438/22 |
| 2003/0199105 A1 * | 10/2003 | Kub et al. | 438/3 |
| 2005/0009246 A1 * | 1/2005 | Enquist et al. | 438/127 |
| 2005/0081958 A1 * | 4/2005 | Adachi et al. | 148/33.1 |
| 2006/0019476 A1 * | 1/2006 | Lagahe et al. | 438/514 |
| 2006/0131482 A1 * | 6/2006 | Blauvelt et al. | 250/214.1 |
| 2008/0265323 A1 * | 10/2008 | Miyairi | 257/347 |
| 2008/0308866 A1 * | 12/2008 | Miyairi | 257/347 |
| 2010/0295083 A1 * | 11/2010 | Celler | 257/98 |
| 2011/0086461 A1 * | 4/2011 | Bolis | 438/65 |

\* cited by examiner

*Primary Examiner* — Colleen A Matthews
*Assistant Examiner* — Regan J Rundio
(74) *Attorney, Agent, or Firm* — Kilpatrick Townsend & Stockton LLP

(57) ABSTRACT

A method of fabricating a semiconductor device includes providing an assembly substrate including a split plane defining a handle region and a transfer region, a film layer coupled to the transfer region, and one or more active devices coupled to the film layer. The method also includes providing a device substrate including one or more bonding regions and joining the assembly substrate to the device substrate. The method further includes splitting the assembly substrate to remove the handle region.

9 Claims, 4 Drawing Sheets

METHOD AND SYSTEM FOR FORMING A MEMBRANE OVER A CAVITY

CROSS-REFERENCES TO RELATED APPLICATIONS

This application claims priority to U.S. Provisional Patent Application No. 61/590,887, filed on Jan. 26, 2012, entitled "Method and System for Forming a Membrane over a Cavity," the disclosure of which is hereby incorporated by reference in its entirety for all purposes.

BACKGROUND OF THE INVENTION

Advanced electronic functions such as photonic device bias control, modulation, amplification, data serialization and de-serialization, framing, routing, and other functions are typically deployed on silicon integrated circuits. A key reason for this is the presence of a global infrastructure for the design and fabrication of silicon integrate circuits that enables the production of devices having very advanced functions and performance at market-enabling costs. Silicon has not been useful for light emission or optical amplification due to its indirect energy bandgap. This deficiency has prevented the fabrication of monolithically integrated opto-electronic circuits on silicon.

Compound semiconductors such as indium phosphide, gallium arsenide, and related ternary and quaternary materials have been extremely important for optical communications, and in particular light emitting devices and photodiodes because of their direct energy bandgap. At the same time, integration of advanced electrical functions on these materials has been limited to niche, high-performance applications due to the much higher cost of fabricating devices and circuits in these materials.

Thus, there is a need in the art for improved methods and systems related to composite integration of silicon and compound semiconductor devices.

SUMMARY OF THE INVENTION

Embodiments of the present invention relate to methods and systems for performing membrane transfer over a cavity (i.e., an open area). More particularly, embodiments of the present invention relate to methods and apparatus for wafer-scale bonding of a membrane to an underlying semiconductor structure including one or more cavities. Embodiments of the present invention have wider applicability than this example and also include applications for wafer bonding of single or composite layers.

According to an embodiment of the present invention, a method of fabricating a semiconductor device is provided. The method includes providing an assembly substrate including a split plane defining a handle region and a transfer region, a film layer coupled to the transfer region, and one or more active devices coupled to the film layer. The method also includes providing a device substrate including one or more bonding regions and joining the assembly substrate to the device substrate. The method further includes splitting the assembly substrate to remove the handle region.

According to another embodiment of the present invention, a method of fabricating a membrane over a cavity is provided. The method includes providing a transfer wafer including a split plane and a membrane layer and providing a device wafer including one or more cavity regions. The method also includes joining the transfer wafer to the device wafer. At least a portion of the membrane layer is suspended over the one or more cavity regions.

Numerous benefits are achieved using the present invention over conventional techniques. For example, in an embodiment according to the present invention, a membrane structure is utilized to provide mechanical support for elements formed using a substrate bonding process. Depending upon the embodiment, one or more of these benefits may exist. These and other benefits have been described throughout the present specification and more particularly below. Various additional objects, features and advantages of the present invention can be more fully appreciated with reference to the detailed description and accompanying drawings that follow.

DETAILED DESCRIPTION OF SPECIFIC EMBODIMENTS

According to the present invention, methods and systems for performing membrane transfer over a cavity (i.e., an open area) are provided. More particularly, embodiments of the present invention relate to methods and apparatus for wafer-scale bonding of a membrane to an underlying semiconductor structure including one or more cavities. Embodiments of the present invention have wider applicability than this example and also include applications for wafer bonding of single or composite layers.

According to an embodiment of the present invention, an implementation of a membrane transfer process over a cavity (open area) by way of wafer bonding and splitting is provided. The split plane is predefined by ion implantation on one of the two bonding wafers. Additional description related to forming split planes is provided in commonly assigned U.S. Pat. No. 8,222,084, issued on Jul. 17, 2012, the disclosure of which is hereby incorporated by reference in its entirety.

Figure 1A:
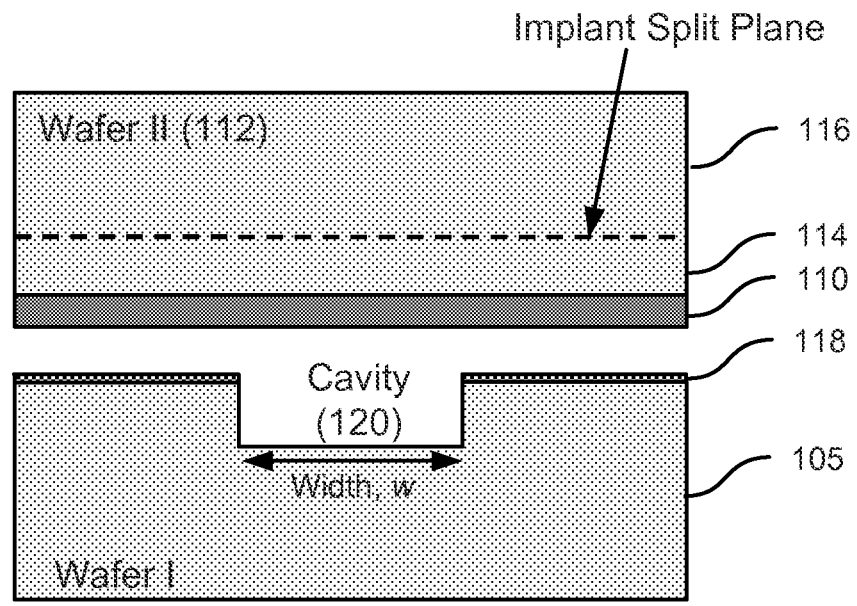
FIG. 1A is a simplified schematic diagram illustrating a membrane attached to a transfer wafer and suspended over a cavity.

FIG. 1A is a simplified schematic diagram illustrating a membrane (including 110 and 114) attached to a transfer wafer (Wafer II—112) and suspended over a cavity 120, which is formed in a device wafer (Wafer I—105). The transfer wafer 112 includes an implant split plane, typically several hundred nanometers or up to one or several microns from the surface abutting membrane 110/114. The implant split plane is formed during an ion implantation process, weakening the mechanical structure at the implant split plane, which is later used in splitting the transfer wafer. Thus, as illustrated in FIG. 1A, a handle portion 116 is formed on one side of the implant split plane and a transfer portion 114 is formed on the side of the implant split plane adjacent the membrane 110/114.

One or more cavities can be formed in the device wafer with varying depth and area. As an example, a cavity with width w is illustrated in FIG. 1. In some embodiments, a mechanically strong film 110, for example, an oxide film such as a silicon oxide film or a silicon nitride film (e.g., $SiO_2$, $Si_3N_4$, metals, alloys, combinations thereof, or the like) can be suspended over a cavity after wafer bonding and splitting. The mechanical support for the membrane (which can include the film 110 and a transfer portion 114 of the transfer wafer 112) suspended over a cavity (open area) can be provided, in part, by the presence of a film (e.g., oxide or nitride) on the wafer that includes the ion implanted split plane. Referring to FIG. 1A, the film is formed or bonded to the transfer wafer 112, which includes an implant split plane. The split plane can be formed by implanting ions to a predetermined depth in the transfer wafer. The thickness of film 110, which can be an oxide layer with a thickness t, can vary depending on the method of fabrication and the dimensions of the cavities, among other factors. As an example, an oxide layer can be thermally grown on a silicon transfer substrate followed by implantation to form the implant split plane. In this example, the thickness of the membrane (including the oxide film and the portion of the transfer substrate between the implant split plane and the oxide film) can be on the order of one micron, typically limited by the implant energy. In another example, the film 110 can be deposited using a chemical vapor deposition (CVD) process, providing independent control over the implant depth and the film thickness. Using a CVD process, increased film thickness can be provided as appropriate to the particular applications and film deposition can occur after implantation, resulting in thicker transfer portions 314 than typically achieved using processes that implant through a film layer. Moreover, a layer transfer process could be utilized to join a film to the transfer substrate. One of ordinary skill in the art would recognize many variations, modifications, and alternatives.

In some embodiments, a film 110 with a thickness of several hundred nanometers (e.g., 200 nm) provides enough mechanical support to prevent fracturing or other damage to the film 110 and the transfer portion 114 extending over a cavity of several microns (e.g., 1-2 microns) in lateral width after wafer splitting. In some embodiments, the total thickness of the film 110 and the transfer portion 114 is considered in determining the membrane strength appropriate for a given cavity size. As an example, a membrane thickness (film+transfer portion) ranging from about 100 nm to about 2 microns is suitable for cavities or gaps ranging from about 1-5 microns.

Figure 1B:
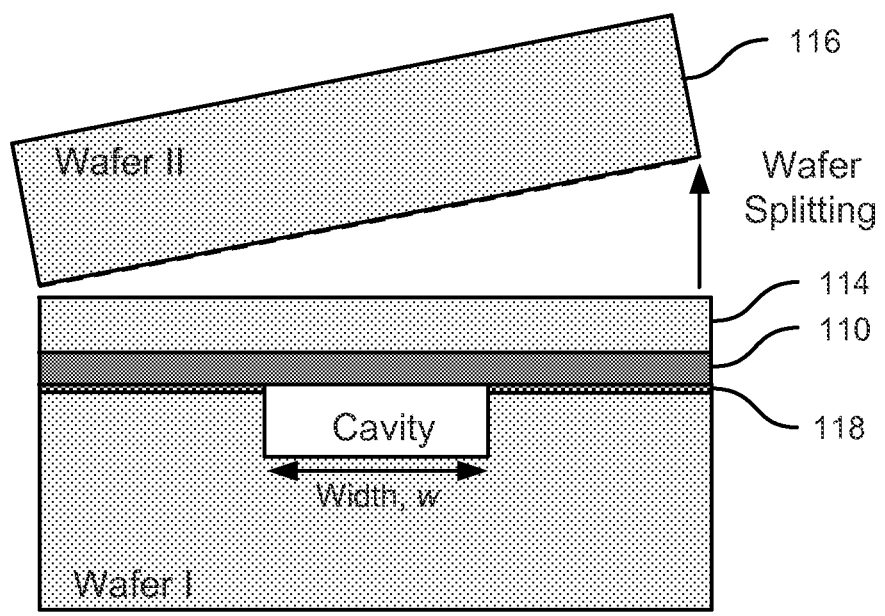
FIG. 1B is a simplified schematic diagram illustrating wafer splitting according to an embodiment of the present invention.

Referring to FIG. 1B, the transfer wafer is joined to the device wafer so that the membrane is suspended over the cavity. The transfer wafer is joined to the device wafer using one or more of a variety of wafer bonding techniques. In the illustrated embodiment, an oxide to silicon bonding process can be used to join the substrates. By way of example, a bonding layer 118 such as an oxide layer can be formed on the device wafer prior to the wafer bonding process. After wafer bonding, the wafer is split at the split plane as illustrated in FIG. 1B.

In some embodiments, the strength of the membrane layer can be increased in conjunction with increases in the width of the cavity. Strengthening of the membrane layer can be accomplished by various methods including increasing the membrane layer thickness, forming a laminated or composite membrane layer with multiple sub-layers, or the like. In some embodiments, to improve the bond/split quality over cavities (open areas), the film (e.g., oxide or nitride) layer thickness can be increased. In these embodiments, thicker oxide (nitride) layers provide better structural/mechanical support to the membrane over the cavity (open area) after wafer splitting.

Figure 2A:
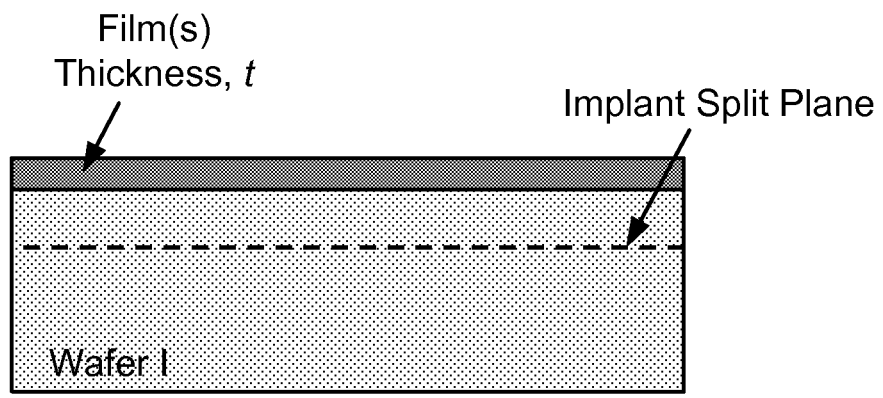
FIG. 2A is a simplified schematic diagram illustrating a membrane formed on a transfer wafer according to another embodiment of the present invention.

FIG. 2A is a simplified schematic diagram illustrating a membrane formed on a transfer wafer according to another embodiment of the present invention. As illustrated in FIG. 2A, a membrane layer can be formed on a substrate including a split plane. The membrane may be one or more layers in composition and is illustrated as a combination of the film layer, which can include multiple sub-films, and the portion of the transfer wafer between the film layer and the implant split plane.

Figure 2B:
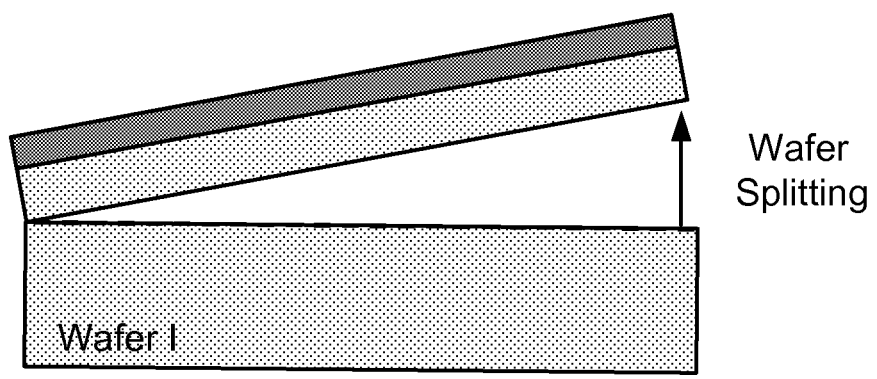
FIG. 2B is a simplified schematic diagram illustrating wafer splitting according to another embodiment of the present invention.

As shown in FIG. 2B, embodiments of the present invention provide a method for releasing a freestanding membrane from a wafer. As shown here, no wafer bonding is utilized in this embodiment and the membrane layer (e.g., an oxide or nitride single or multi-layer film and the transfer portion of the transfer wafer) provides the mechanical support to the freestanding membrane. After releasing the membrane, it can be transferred to a different substrate or used as a freestanding membrane. In some embodiments, thicker membrane layers are utilized in conjunction with larger membrane areas since increasing the thickness of the membrane layer (e.g., oxide or nitride) provides better structural/mechanical support for freestanding membranes. It should also be noted that freestanding membranes can be used to transfer predefined structures on to a different substrate or be utilized in their membrane configuration.

Figure 3A:
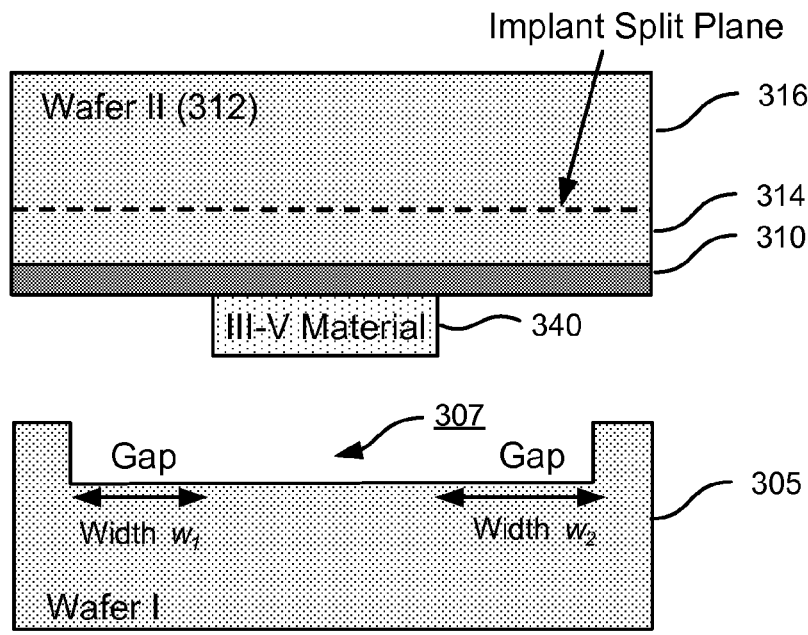
FIG. 3A is a simplified schematic diagram illustrating a transfer substrate including a bonded die and a device substrate according to an embodiment of the present invention.

FIG. 3A is a simplified schematic diagram illustrating a transfer substrate including a bonded die and a device substrate according to an embodiment of the present invention. As illustrated in FIG. 3A, a III-V die 340, previously diced/cleaved from a III-V substrate, which could include processing to form one or more devices on the die, is bonded to film layer 310. In order to facilitate bonding of the transfer substrate 312 to device substrate 310, a cavity 307 with a lateral area larger than the lateral area of the III-V die 340 is provided on the device substrate. As a result of the differing lateral areas, one or more cavities or gaps will be formed. Although only two gaps (with width $w_1$ and $w_2$) are illustrated in FIG. 3A, it will be appreciated that gaps positioned in the plane normal to the figure will typically be formed. Accordingly, one could consider the gaps to form a moat structure surrounding all four lateral sides of the III-V die since the III-V die is smaller than the cavity 307 formed in the device substrate in typical implementations. As described herein, after wafer splitting, the film 310, along with other layers (e.g., layer 314), provides sufficient mechanical support for the portions remaining over the cavities after bonding will not collapse.

Although FIG. 3A illustrate the III-V die as bonded to the film 310, this is not required by the present invention and the III-V die may be electrically connected to the transfer portion 314, either through vias passing through the film 310 or because portions of the film have been removed to provide a bonding location for the III-die on the transfer portion 314. One of ordinary skill in the art would recognize many variations, modifications, and alternatives.

Figure 3B:
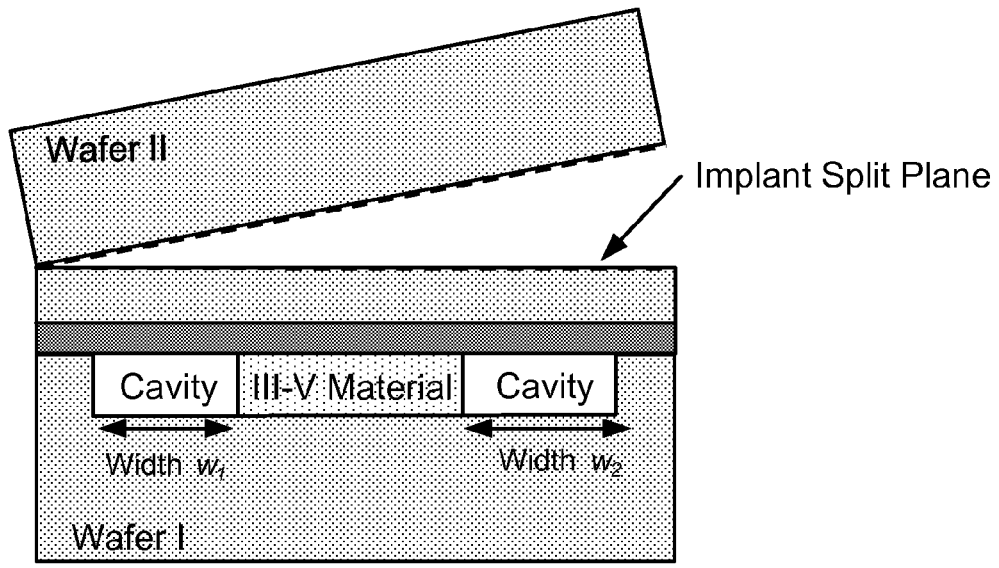
FIG. 3B is a simplified schematic diagram illustrating wafer splitting after bonding of the transfer substrate to the device substrate according to an embodiment of the present invention.

FIG. 3B is a simplified schematic diagram illustrating wafer splitting after bonding of the transfer substrate to the device substrate according to an embodiment of the present invention. As illustrated in FIG. 3B, the III-V die has been bonded to the device wafer at the lower portion of the cavity 307, thereby producing a set of cavities (as well as other cavities (not shown) present in the plane normal to the figure). Accordingly, the cavities or gaps can be portions of a moat laterally surrounding the III-V die. Although a single III-V die is illustrated, the present invention is not limited to this single die and multiple dies can be bonded to the device substrate according to embodiments of the present invention.

As illustrated in FIGS. 3A and 3B, a process that includes transferring chips/III-V dies made from III-V materials with defined sized into pre-defined receptor sites or cavities 307, will typically result in a gap being present between the lateral edges of the receptor sites and the chips/III-V dies. In fact, in order to reduce manufacturing and alignment tolerances, it may be advantageous to utilize these lateral gaps. The cavity widths (e.g., $w_1$ and $w_2$) can be dependent on the alignment accuracy of the tool used for bonding of the transfer substrate and the device substrate and can be used to ensure that the chips/III-V die will fit within the lateral dimensions of the receptor site.

By utilizing embodiments of the present invention, the membrane will preferably have enough mechanical stability not to fall apart/break after the wafer splitting process is performed. In order to increase the mechanical strength of the membranes, which will enable larger cavities, the thickness of the film 310 and/or the transfer portion 314 can be increased, enabling a reduction in the required tolerances during the substrate bonding process.

In some implementations, the structure defined after wafer splitting (bounded by Wafer I and the implant split plane) can be used in subsequent fabrication processes. The transfer portion 314 of Wafer II can include a silicon layer (e.g., single crystal silicon) that can be used to fabricate transistors or other electronics, waveguide structures, and the like. Additionally, additional structures can be bonded, deposited, or otherwise fabricated on the structure to provide additional device functionality. One of ordinary skill in the art would recognize many variations, modifications, and alternatives.

Figure 4:
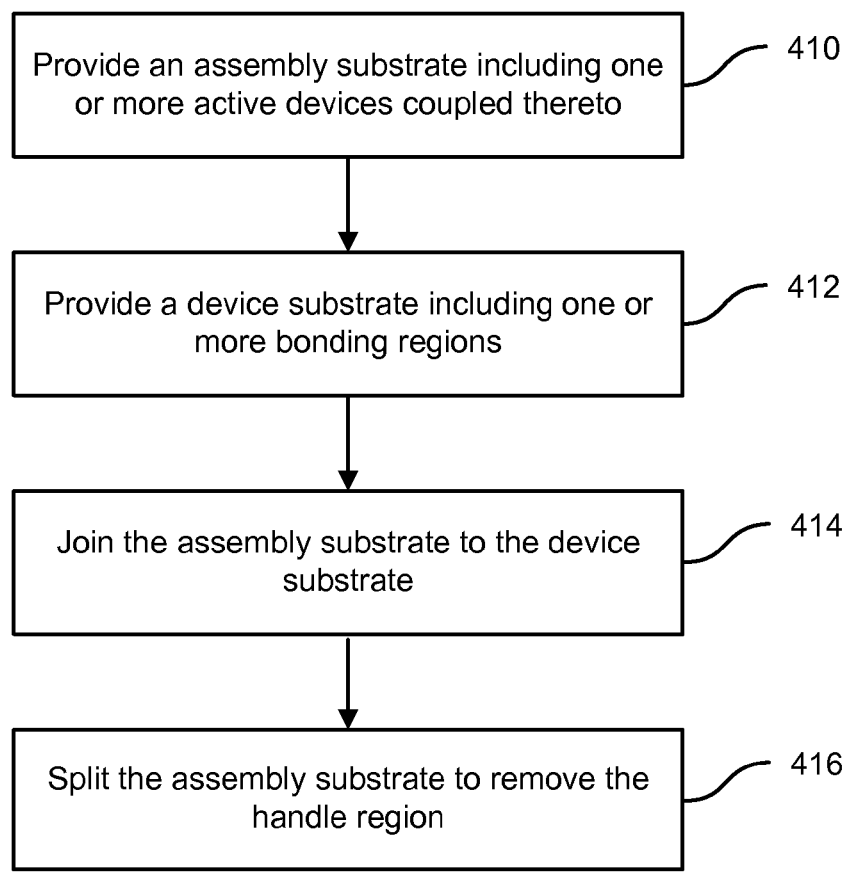
FIG. 4 is a simplified flowchart illustrating a method of fabricating a semiconductor device according to an embodiment of the present invention.

FIG. 4 is a simplified flowchart illustrating a method of fabricating a semiconductor device according to an embodiment of the present invention. The method includes providing an assembly substrate (e.g., a silicon substrate) including a split plane (e.g., a ion implanted region) defining a handle region and a transfer region. A film layer is coupled to the transfer region of the assembly substrate, for example, by thermally growing an oxide film, depositing an oxide film, which may be part of a multi-layer structure, or the like. The film layer can include oxide layers, nitride layers, combinations thereof, or the like. One or more active devices are coupled to the film layer (410). The active devices can include III-V optical or electronic devices.

The method also includes providing a device substrate (e.g., a silicon substrate) including one or more bonding regions (412) and joining the assembly substrate to the device substrate (414). The bonding regions can be formed as receptor sites, with lateral dimensions on the order of (e.g., slightly larger) than the lateral dimensions of the active devices that are bonded to the bonding regions. As illustrated in FIG. 3B, joining the assembly substrate to the device substrate can include bonding the film layer to the portions of the device substrate bounding the receptor sites. As also illustrated in FIG. 3B, joining the assembly substrate to the device substrate can include bonding a surface of the one or more active devices (i.e., the surface opposing the film 312) to the one or more bonding regions of the device substrate (i.e., the bottom of the receptor site).

The method further includes splitting the assembly substrate to remove the handle region (416). After bonding of the substrates, at least a portion of the film layer is suspended over a cavity or gap formed between the one or more active devices and a portion of the device substrate. As described herein, the presence of the film layer and the transfer region (forming a membrane structure) provide mechanical support to prevent fracturing as a result of the lateral gap between the active devices and edges of the receptor sites formed in the device substrate.

In some embodiments, the method additionally includes fabricating one or more additional layers coupled to the transfer region of the assembly substrate. Accordingly, subsequent fabrication processes can be used to fabricate electronic devices, optical devices, opto-electronic devices, or the like.

It should be appreciated that the specific steps illustrated in FIG. 4 provide a particular method of fabricating a semiconductor device according to an embodiment of the present invention. Other sequences of steps may also be performed according to alternative embodiments. For example, alternative embodiments of the present invention may perform the steps outlined above in a different order. Moreover, the individual steps illustrated in FIG. 4 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of fabricating a semiconductor device, the method comprising:
   providing an assembly substrate including a split plane defining a handle region and a transfer region, a film layer coupled to the transfer region, and one or more active devices coupled to the film layer;
   providing a device substrate including one or more bonding regions, wherein the one or more bonding regions include one or more receptor sites;
   joining the assembly substrate to the device substrate, wherein joining the assembly substrate to the device substrate comprises directly bonding the film layer to a portion of the device substrate and directly bonding the one or more active devices to the one or more receptor sites of the device substrate, and wherein at least a portion of the film layer is suspended over a cavity formed between the one or more active devices directly bonded to the one or more receptor sites and the portion of the device substrate directly bonded to the film layer; and
   splitting the assembly substrate to remove the handle region.

2. The method of claim 1 wherein the one or more active devices comprises III-V optical or electronic devices.

3. The method of claim 1 wherein the assembly substrate comprises a silicon substrate.

4. The method of claim 1 further comprising fabricating one or more additional layers coupled to the transfer region of the assembly substrate.

5. The method of claim 1 wherein the split plane comprises an ion implanted region.

6. The method of claim 1 wherein the film layer comprises one or more oxide or nitride layers.

7. The method of claim 1 wherein the device substrate comprises a silicon substrate.

8. The method of claim 1 wherein
the transfer region and the film layer are characterized by a combined thickness of about 100 nm to 2 microns.

9. The method of claim 1 wherein joining the assembly substrate to the device substrate comprises forming a bonding layer on the portion of the device substrate and bonding the film layer to the bonding layer.

\* \* \* \* \*